(12) United States Patent  
Hsu et al.

(10) Patent No.: US 11,978,802 B2
(45) Date of Patent: May 7, 2024

(54) FINFET DEVICES AND METHODS OF FORMING THE SAME

(71) Applicant: Taiwan Semiconductor Manufacturing Co., Ltd., Hsinchu (TW)

(72) Inventors: Chung-Wei Hsu, Hsinchu County (TW); Chih-Hao Wang, Hsinchu County (TW); Huan-Chieh Su, Changhua County (TW); Wei-Hao Wu, Hsinchu (TW); Zhi-Chang Lin, Hsinchu County (TW); Jia-Ni Yu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 541 days.

(21) Appl. No.: 16/218,493

(22) Filed: Dec. 13, 2018

(65) Prior Publication Data

US 2020/0044086 A1 Feb. 6, 2020

Related U.S. Application Data

(60) Provisional application No. 62/712,233, filed on Jul. 31, 2018.

(51) Int. Cl.
*H01L 29/78* (2006.01)
*H01L 21/28* (2006.01)
*H01L 21/768* (2006.01)
*H01L 29/423* (2006.01)
*H01L 29/49* (2006.01)
(Continued)

(52) U.S. Cl.
CPC .... *H01L 29/7851* (2013.01); *H01L 21/28088* (2013.01); *H01L 21/28114* (2013.01); *H01L 21/76832* (2013.01); *H01L 29/42376* (2013.01); *H01L 29/4966* (2013.01);
(Continued)

(58) Field of Classification Search
CPC ......... H01L 21/28088; H01L 21/28114; H01L 21/28247; H01L 21/76832; H01L 21/76834; H01L 21/76843; H01L 21/76847; H01L 29/165; H01L 29/42376; H01L 29/4966; H01L 29/51; H01L 29/6653; H01L 29/66545; H01L 29/6656; H01L 29/66795; H01L 29/7848; H01L 29/785; H01L 29/7851
See application file for complete search history.

(56) References Cited

U.S. PATENT DOCUMENTS

8,772,109 B2 7/2014 Colinge
8,785,285 B2 7/2014 Tsai et al.
(Continued)

*Primary Examiner* — Kenneth Parker
*Assistant Examiner* — Christopher A Culbert
(74) *Attorney, Agent, or Firm* — JCIPRNET (57) ABSTRACT

Provided are FinFET devices and methods of forming the same. A dummy gate having gate spacers on opposing sidewalls thereof is formed over a substrate. A dielectric layer is formed around the dummy gate. An upper portion of the dummy gate is removed and upper portions of the gate spacers are removed, so as to form a first opening in the dielectric layer. A lower portion of the dummy gate is removed to form a second opening below the first opening. A metal layer is formed in the first and second openings. The metal layer is partially removed to form a metal gate.

20 Claims, 11 Drawing Sheets (51) Int. Cl.
*H01L 29/51* (2006.01)
*H01L 29/66* (2006.01)

(52) U.S. Cl.
CPC ........ *H01L 29/51* (2013.01); *H01L 29/66545* (2013.01); *H01L 29/6656* (2013.01); *H01L 29/66795* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,093,467 B1 * | 7/2015 | Xie ................... H01L 29/78 |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2014/0035000 A1 * | 2/2014 | Ontalus ............... H01L 29/0847 257/192 |
| 2017/0062436 A1 * | 3/2017 | Guillorn ............ H01L 21/30604 |
| 2017/0077256 A1 * | 3/2017 | Adusumilli ....... H01L 21/28088 |
| 2017/0084449 A1 * | 3/2017 | Dube .................. H01L 21/283 |
| 2017/0194499 A1 * | 7/2017 | Cai ................... H01L 21/28141 |

\* cited by examiner

FINFET DEVICES AND METHODS OF FORMING THE SAME

CROSS-REFERENCE TO RELATED APPLICATION

This application claims the priority benefits of U.S. provisional application Ser. No. 62/712,233, filed on Jul. 31, 2018. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1K are schematic cross-sectional views of a method of forming a FinFET device in accordance with some embodiments.

Figure 1A:
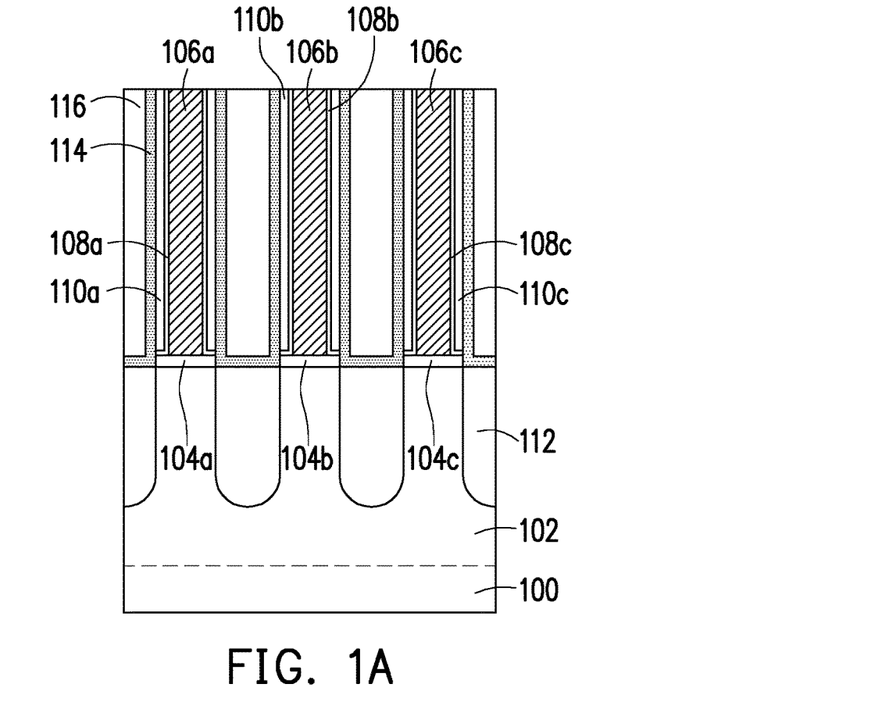
FIG. 1A to FIG. 1K are schematic cross-sectional views of a method of forming a FinFET device in accordance with some embodiments.

Referring to FIG. 1A, a substrate 100 is provided with one or more fins 102 extending in a direction. In some embodiments, the substrate 100 includes a silicon-containing substrate, a silicon-on-insulator (SOI) substrate, or a substrate formed of other suitable semiconductor materials. The substrate 100 and the fins 102 may be made by the same material or different materials. Depending on the requirements of design, the substrate 100 may be a P-type substrate or an N-type substrate and may have doped regions therein. The doped regions may be configured for a P-type FinFET device or an N-type FinFET device. In some embodiments, the substrate 100 has an isolation layer formed thereon. Specifically, the isolation layer covers lower portions of the fins 102 and exposes upper portions of the fins 102. In some embodiments, the isolation layer is a shallow trench isolation (STI) structure.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Multiple dummy gates 106a to 106c are formed over the substrate 100. In some embodiments, the dummy gates 106a to 106c extend in a direction different from (e.g., perpendicular to) the extending direction of the fins 102. In some embodiments, each of the dummy gates 106a to 106c includes a silicon-containing material such as polysilicon, and the forming method thereof includes performing a suitable deposition process followed by photolithography etching processes. The dummy gates 106a to 106c have an aspect ratio of about 5, about 10 or more. In some embodiments, multiple interfacial layers 104a to 104c are respectively formed between the dummy gates 106a to 106c and the substrate 100. In some embodiments, each of the interfacial layers 104a to 104c includes silicon oxide, and the forming method thereof includes performing a thermal process or a deposition process. The dummy gates 106a to 106c may respectively have inner gate spacers 108a to 108c and outer gate spacers 110a to 110c on opposing sidewalls thereof. In some embodiments, each of the gate spacers 108a to 108c and 110a to 110c includes a low-k material having a dielectric constant less than about 4 or about 3.5. The low-k material included in the gate spacers 108a to 108c has a dielectric constant different from that of the low-k material included in the gate spacers 110a to 110c. In some embodiments, each of the gate spacers 108a to 108c has an L-shape in cross-section, and each of the gate spacers 110a to 110c has an I-shape in cross-section.

Thereafter, strained layers 112 are formed in the substrate 100 aside the dummy gates 106a to 106c. In some embodiments, two strained layers 112 are formed beside each of the dummy gates, and one of the strained layers 112 is between the adjacent dummy gates. In some embodiments, the strained layers 112 include silicon germanium (SiGe) for a P-type FinFET device. In alternative embodiments, the strained layers 112 include silicon carbon (SiC), silicon phosphate (SiP), SiCP or a SiC/SiP multi-layer structure for an N-type FinFET device. In some embodiments, the strained layers 112 may be optionally implanted with a P-type dopant or an N-type dopant as needed. In some embodiments, the method of forming the strained layers 112 includes forming recesses in the fins 102, and growing epitaxy layers from the recesses. In some embodiments, the strained layers 112 are referred to as source/drain regions.

Afterwards, a dielectric layer 116 is formed over the substrate 100 aside or around the dummy gates 106a to 106c. In some embodiments, the dielectric layer 116 includes oxide such as silicon oxide, phosphosilicate glass (PSG), borosilicate glass (BSG), boron-doped phosphosilicate glass (BPSG), a combination thereof or the like. In some embodiments, an etch stop layer 114 is formed after the operation of forming the strained layers 112 and before the operation of forming the dielectric layer 116. In some embodiments, the etch stop layer 114 includes SiN, SiC or the like. In some embodiments, the etch stop layer 114 is referred to as a contact etch stop layer (CESL). In some embodiments, after the operation of forming the strained layers 112, an etch stop material layer and a dielectric material layer are formed on the substrate 100 filling gaps between the dummy gates by a suitable deposition technique such as spin-coating, CVD, PVD, ALD, a combination thereof or the like. Thereafter, the etch stop material layer and the dielectric material layer are planarized by a suitable technique such as CMP, until tops of the dummy gates are exposed. In some embodiments, the top surfaces of the dielectric layer 116 and the etch stop layer 114 are substantially coplanar with the top surfaces of the dummy gates 106a to 106c.

Figure 1B:
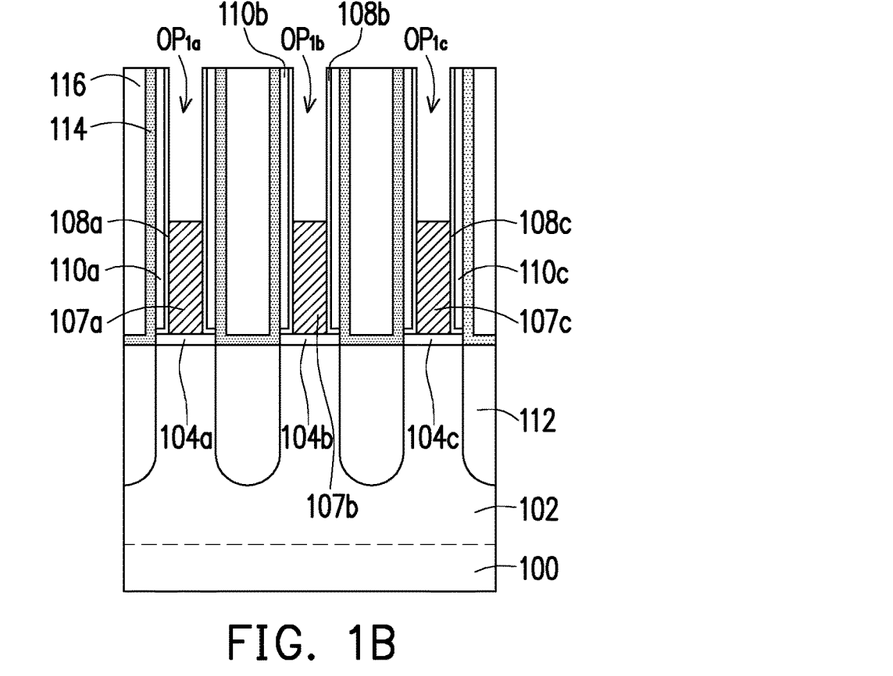

Referring to FIG. 1B, upper portions of the dummy gates 106a to 106c are removed, and therefore, first openings $OP_{1a}$ to $OP_{1c}$ are formed in the dielectric layer 116. The lower portions of the dummy gates 106a to 106c or the remaining dummy gates are referred to as dummy gates 107a to 107c. In some embodiments, the upper portions of the dummy gates 106a to 106c are removed by an etching process with an etch gas including $NF_3$.

Figure 1C:
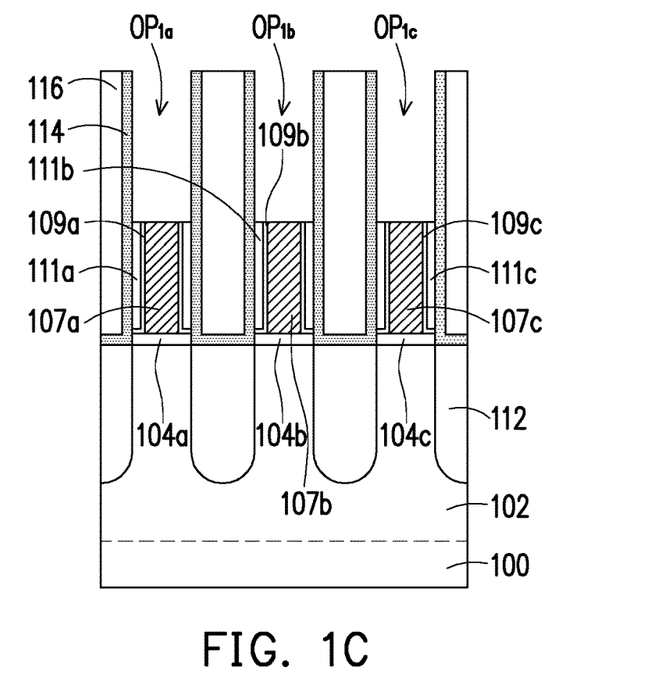

Referring to FIG. 1C, upper portions of the gate spacers 108a to 108c and 110a to 110c are removed so as to widen the first openings $OP_{1a}$ to $OP_{1c}$. The lower portions of the gate spacers 108a to 108c and 110a to 110c or the remaining gate spacers are referred to as gate spacers 109a to 109c and 111a to 111c. In some embodiments, the upper portions of the gate spacers 108a to 108c and 110a to 110c are removed by an etching process with an etch gas including $CHF_3$. In some embodiments, the widened first openings $OP_{1a}$ to $OP_{1c}$ expose the etch stop layer 114.

Figure 1D:
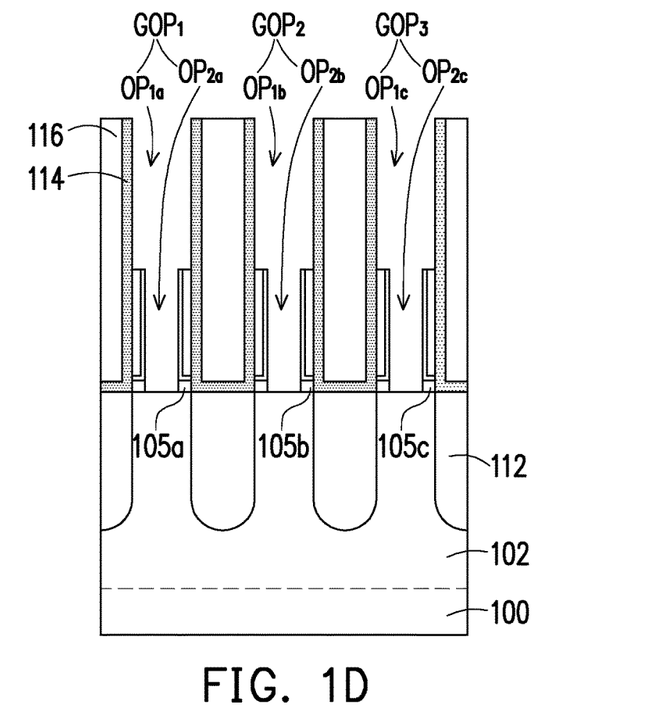

Referring to FIG. 1D, the dummy gates 107a to 107c (e.g., the lower portions of the dummy gates 106a to 106c) are removed, and therefore, second openings $OP_{2a}$ to $OP_{2c}$ are formed respectively below the first openings $OP_{1a}$ to $OP_{1c}$. In some embodiments, the dummy gates 107a to 107c (e.g., the lower portions of the dummy gates 106a to 106c) are removed by an etching process with an etch gas including $NF_3$. In some embodiments, portions of the interfacial layers 104a to 104c are removed during the removal of the dummy gates 107a to 107c. The remaining interfacial layers 104a to 104c are referred to as interfacial layers 105a to 105c.

In some embodiments, the first openings $OP_{1a}$ to $OP_{1c}$ may have an aspect ratio less than that of the second openings $OP_{2a}$ to $OP_{2c}$. For example, the aspect ratio of the first openings $OP_{1a}$ to $OP_{1c}$ is about 1.5 or more, and the aspect ratio of the second openings $OP_{2a}$ to $OP_{2c}$ is about 3 or more.

In some embodiments, the first openings $OP_{1a}$ to $OP_{1c}$ are wider than the second openings $OP_{2a}$ to $OP_{2c}$. Specifically, the wider first opening $OP_{1a}$ and the narrower second opening $OP_{2a}$ constitute a T-shaped gate opening $GOP_1$, the wider first opening $OP_{1b}$ and the narrower second opening $OP_{2b}$ constitute a T-shaped gate opening $GOP_2$, and the wider first opening $OP_{1c}$ and the narrower second opening $OP_{2c}$ constitute a T-shaped gate opening $GOP_3$.

After the operations of FIG. 1B to FIG. 1D, the dummy gates 106a to 106c, portions of the gate spacers 108a to 108c and portions of the gate spacers 110a to 110c are removed, and therefore, T-shaped gate openings $GOP_1$ to $GOP_3$ are formed in the dielectric layer 116.

Figure 1E:
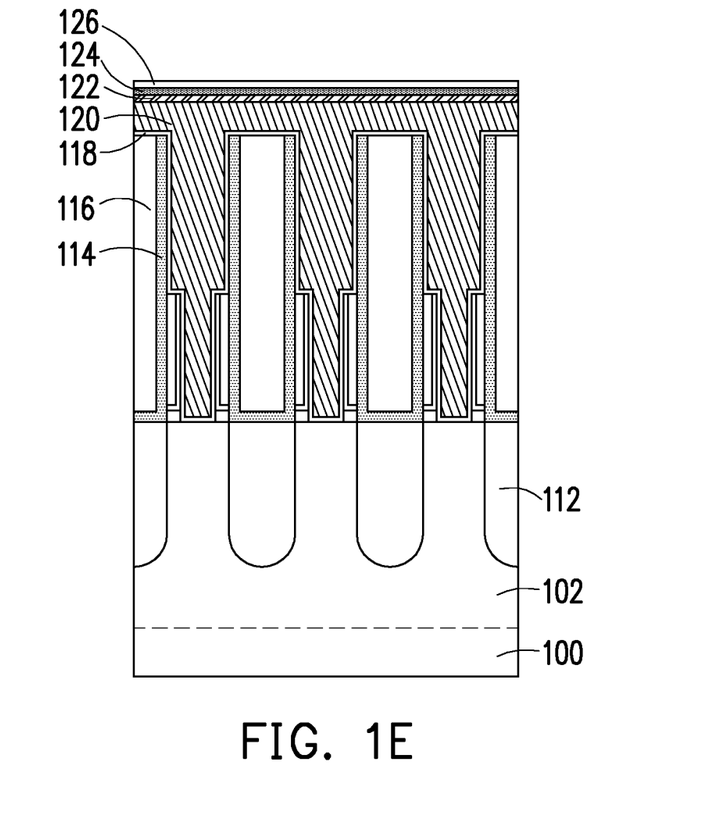

Referring to FIG. 1E, a metal layer 120 is formed in the first openings $OP_{1a}$ to $OP_{1c}$ and the second openings $OP_{2a}$ to $OP_{2c}$. Specifically, the metal layer 120 is formed over the substrate 100 and fills in the gate openings $GOP_1$ to $GOP_3$ with a CVD, PVD, plating, or a suitable process. The metal layer 120 may be formed with an improved gate-fill capability since the T-shaped gate openings $GOP_1$ to $GOP_3$ have wider tops for metal deposition. Accordingly, the metal layer 120 is formed as a seamless or void-free metal layer.

In some embodiments, the metal layer 120 includes a work function metal layer. In some embodiments, the work function metal layer is a P-type work function metal layer to provide a gate electrode that properly performs in a P-type FinFET device. The P-type work function metal layer may include TiN, WN, TaN, conductive metal oxide, and/or a suitable material. In alternative embodiments, the work function metal layer is an N-type work function metal layer to provide a gate electrode that properly performs in an N-type FinFET device. The P-type work function metal layer may include TiAl, TiAlN, or TaCN, conductive metal oxide, and/or a suitable material.

In some embodiments, a gate dielectric material layer 118 is formed after the operation of forming the gate openings $GOP_1$ to $GOP_3$ and before the operation of forming the metal layer 120. The gate dielectric material layer 118 may include a high-k material having a dielectric constant greater than 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, $BaZrO$, $HfZrO$, $HfLaO$, $HfTaO$, $HfTiO$, a combination thereof, or a suitable material. In alternative embodiments, the gate dielectric material layer 118 may optionally include a silicate such as HfSiO, LaSiO, AlSiO, a combination thereof or a suitable material.

In some embodiments, a low-resistance layer 122, a first capping layer 124 and a second capping layer 126 are optionally formed above the metal layer 120. Specifically, the low-resistance layer 122, the first capping layer 124 and the second capping layer 126 may be omitted when the metal layer 120 completely fills the gate openings $GOP_1$ to $GOP_3$. Alternatively, the low-resistance layer 122, the first capping layer 124 and the second capping layer 126 may be required when the metal layer 120 does not completely fill the gate openings $GOP_1$ to $GOP_3$, which will be further described in FIG. 3A to FIG. 3B.

The low-resistance layer 122 may include tungsten (W), cobalt (Co), copper (Cu), aluminum (Al) or the like. Each of the first capping layer 124 and the second capping layer 126 may include a dielectric material. In some embodiments, the first capping layer 124 includes silicon nitride, and the second capping layer 126 includes silicon oxide.

Figure 1F:
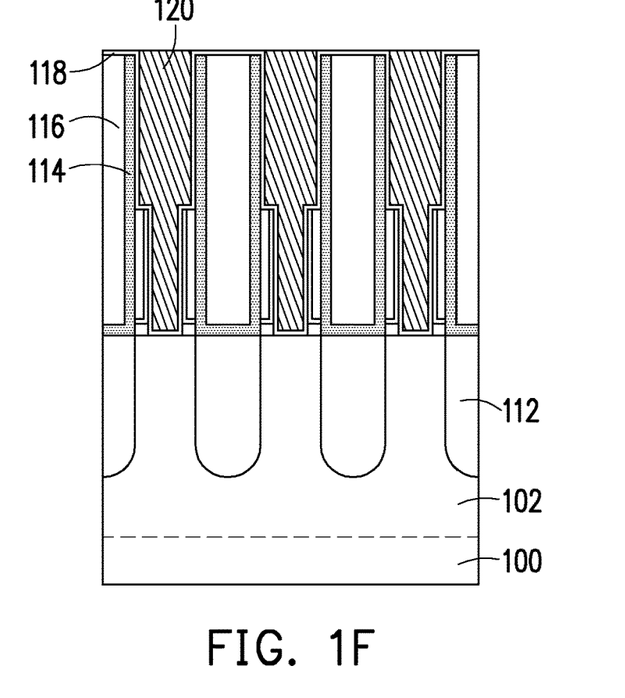
Figure 1G:
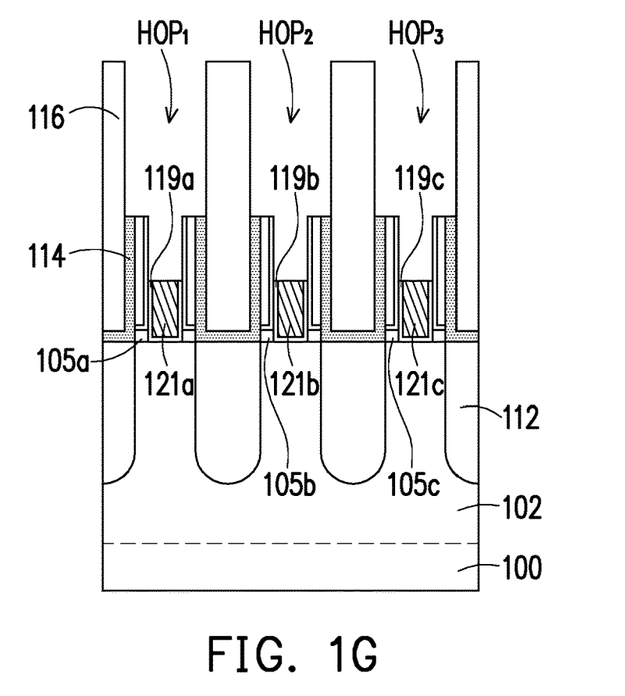

Referring to FIG. 1F and FIG. 1G, the metal layer 120 is partially removed to form metal gates 121a to 121c, and therefore, helmet openings $HOP_1$ to $HOP_3$ are formed in the dielectric layer 116 and expose the metal gates 121a to 121c. In some embodiments, the upper portions of the gate openings $GOP_1$ and $GOP_3$ (labelled in FIG. 1D) are referred to as helmet openings $HOP_1$ to $HOP_3$ (labelled in FIG. 1G) for subsequent helmet deposition.

In some embodiments, as shown in FIG. 1F, a planarization process such as a CMP process is performed to remove the metal layer 120 outside of the gate openings $GOP_1$ to $GOP_3$ (labelled in FIG. 1D). In some embodiments, the top surface of the remaining metal layer 120 is substantially coplanar with the top surface of the gate dielectric material layer 118.

Thereafter, as shown in FIG. 1G, the gate dielectric material layer 118 and the metal layer 120 are partially removed to form gate dielectric layers 119a to 119c and metal gates 121a to 121c in the lower portions of the gate openings $GOP_1$ and $GOP_3$ (labelled in FIG. 1D). In some embodiments, a portion of the etch stop layer 114 is removed during the partial removal of the gate dielectric material layer 118 and the metal layer 120. The top surface of the remaining etch stop layer 114 is substantially coplanar with the top surfaces of the gate spacers 109a to 109c and 111a to 111c (labelled in FIG. 1C).

In some embodiments, the gate dielectric layers 119a to 119c and the metal gates 121a to 121c constitute metal gate stacks (or called "replacement gate stacks"). In some embodiments, the metal gate stacks extend in a direction different from (e.g., perpendicular to) the extending direction of the fins 102. In some embodiments, the gate dielectric layers 119a to 119c respectively surround the sidewalls and bottoms of the metal gates 121a to 121c and on the tops and sidewalls of the fins 102, as shown in FIG. 1G. In some embodiments, optional interfacial layers such as silicon oxide layers are formed between the fins 102 and the gate dielectric layers 119a to 119c.

Figure 1H:
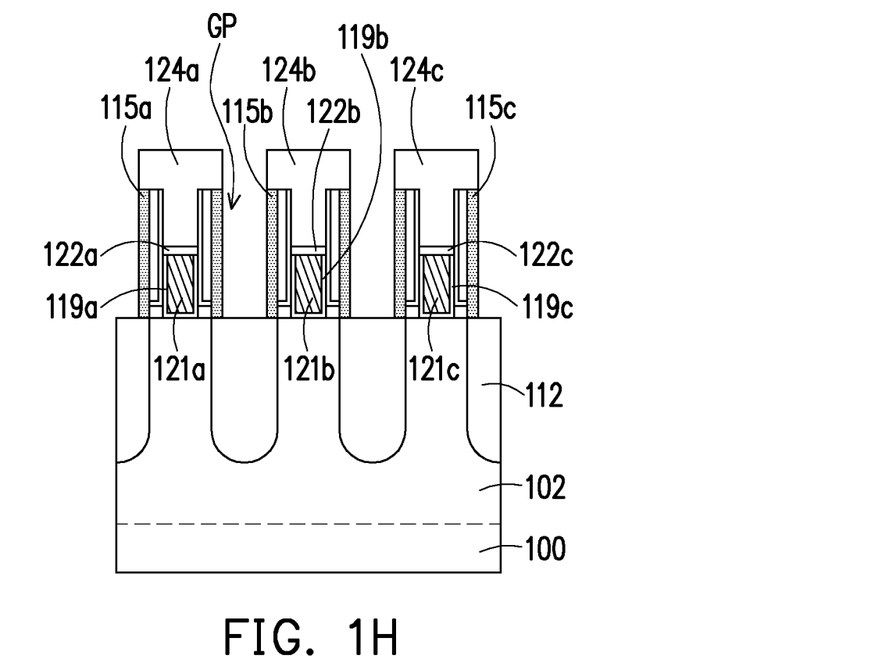

Referring to FIG. 1H, dielectric helmets 124a to 124c are respectively formed in the helmet openings $HOP_1$ to $HOP_3$. In some embodiments, the dielectric helmets 124a to 124c include metal oxide, metal nitride or a combination thereof. The metal oxide may include $ZrO_2$, $HfO_2$, $TiO_2$, $Al_2O_3$ or the like. The metal nitride may include ZrN, HfN, TiN, AlN or the like. The materials of the dielectric helmets 124a to 124c are not limited by the present disclosure. Other materials may be applied as long as these materials serve as hard masks for protecting the underlying gates from being damaged by the subsequently processes. For example, the dielectric helmets 124a to 124c may include a high-k material having a dielectric constant greater than 4, a low-k material having a dielectric constant less than 4 or a combination thereof. Each of the dielectric helmets 124a to 124c may be a single-layer or multi-layer structure. In some embodiments, the dielectric helmets 124a to 124c are formed by a suitable deposition process followed by a planarization process.

In some embodiments, optional shielding layers 122a to 122c are respectively formed between the metal gates 121a to 121c and the dielectric helmets 124a to 124c. In some embodiments, the shielding layers 122a to 122c include metal such as tungsten (W), cobalt (Co), copper (Cu), titanium (Ti) or the like, and the forming method thereof includes performing a selective ALD process. The shielding layers 122a to 122c and the dielectric helmets 124a to 124c are configured to protect the metal gates 121a to 121c from being damaged by the subsequent processes. In some embodiments, the shielding layers 122a to 122c are referred to as contact etch stop layers.

Still referring to FIG. 1H, the dielectric layer 116 and a portion of the etch stop layer 114 are removed to form gaps GP that expose the strained layers 112. In some embodiments, the dielectric layer 116 and the portion of the etch stop layer 114 are removed by an etching process with an etch gas including $CF_4$. The remaining etch stop layer 114 forms etch stop patterns 115a to 115c respectively at outer sides of the gate spacers 111a to 111c. Specifically, the etch stop patterns 115a to 115c are arranged to surround lower parts of the dielectric helmets 124a to 124c, and the edges of the etch stop patterns 115a to 115c are aligned with the edges of the corresponding dielectric helmets 124a to 124c.

Figure 1I:
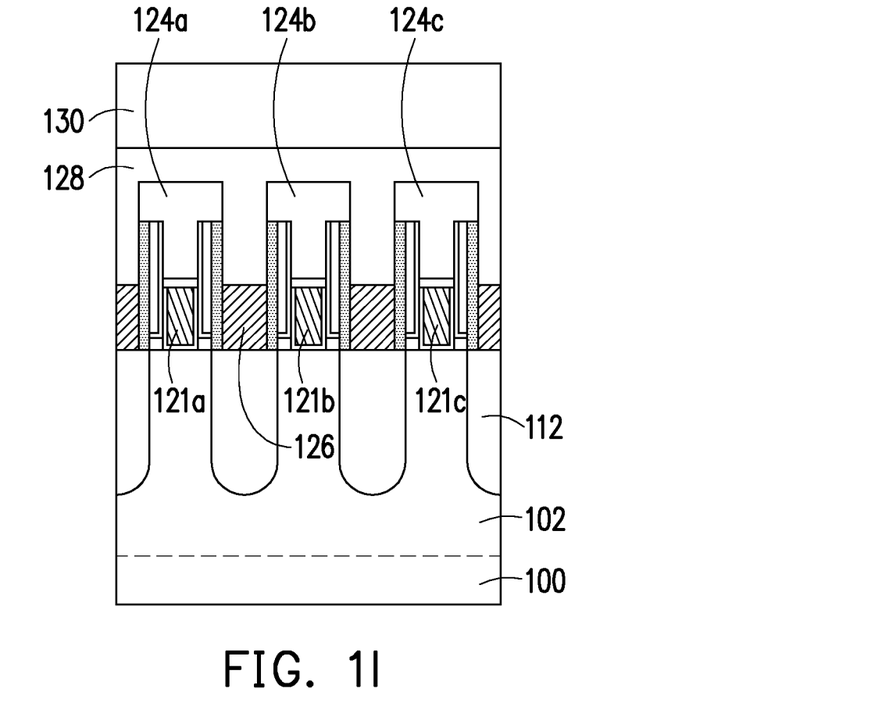

Referring to FIG. 1I, metal stacks 126 are formed in lower portions of the gaps GP (labelled in FIG. 1H). In some embodiments, the top surfaces of the metal gates 126 are substantially coplanar with the top surfaces of the metal gates 121a to 121c. In some embodiments, the metal stacks 126 include metal such as tungsten (W), cobalt (Co), copper (Cu), titanium (Ti) or the like, and the forming method thereof includes performing a suitable deposition process followed by an etching back process. In some embodiments, optional shield layers or contact etch stop layers are respectively formed over the metal stacks 126.

Thereafter, a first dielectric layer 128 is formed over the substrate 100, covering the dielectric helmets 124a to 124c and filling upper portions of the gaps GP (labelled in FIG. 1H). In some embodiments, the first dielectric layer 128 includes SiN, SiC or the like. In some embodiments, the first dielectric layer 128 is referred to as a contact etch stop layer. Afterwards, a second dielectric layer 130 is formed over the first dielectric layer 128. In some embodiments, the second dielectric layer 130 includes oxide such as silicon oxide, phosphosilicate glass (PSG), borosilicate glass (BSG), boron-doped phosphosilicate glass (BPSG), a combination thereof or the like. Each of the first dielectric layer 128 and the second dielectric layer 130 is formed by a suitable deposition technique such as spin-coating, CVD, PVD, ALD, a combination thereof or the like.

Figure 1J:
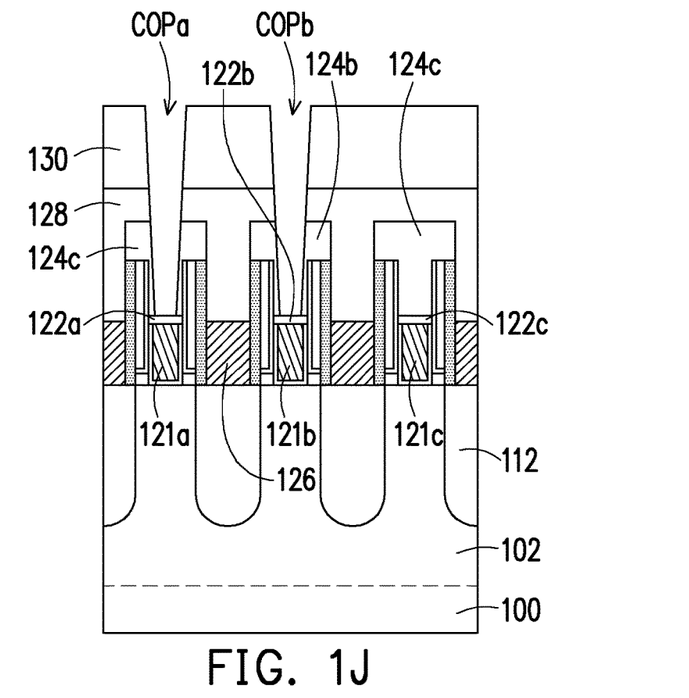

Referring to FIG. 1J, the second dielectric layer 130, the first dielectric layer 128 and the dielectric helmets 124a to 124b are patterned or partially removed, so as to form contact openings COPa and COPb (or called "contact holes") corresponding to the metal gates 121a and 121b. In some embodiments, the patterning operation is implemented by an etching process with an etch gas including $BCl_3$ and $Cl_2$. In some embodiments, after the second dielectric layer 130 is formed, a hard mask layer with multiple openings is formed on the second dielectric layer 130. The openings of the hard mask layer may correspond to the intended locations of the subsequently formed contact holes. In some embodiments, the hard mask layer includes a photoresist material, a dielectric material or a combination thereof. Thereafter, portions of the second dielectric layer 130, the first dielectric layer 128 and the dielectric helmets 124a to 124b are etched by using the hard mask layer as an etch mask.

In some embodiments, the contact openings COPa and COPb penetrate through the second dielectric layer 130, the first dielectric layer 128 and the dielectric helmets 124a to 124b and expose the corresponding shielding layers 122a and 122b. The contact openings COPa and COPb may have tilted sidewalls. In some embodiments, as shown in FIG. 1J, the contact openings COPa and COPb are separated from the gate spacers 109a to 109b and 111a to 111b (labelled in FIG. 1C). However, the present disclosure is not limited thereto. In alternative embodiments, at least one of the contact openings COPa and COPb is in physical contact with the adjacent gate spacers 109a to 109b and/or gate spacers 111a to 111b.

Figure 1K:
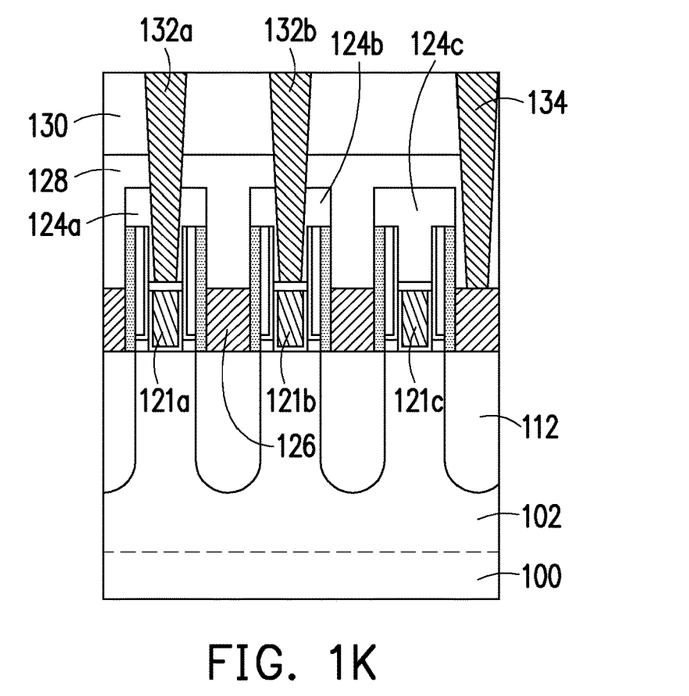

Referring to FIG. 1K, gate contacts 132a and 132b are respectively formed in the contact openings COPa and COPb. In some embodiments, the gate contacts 132a and 132b are intended to represent any type of conductive materials and structures that are electrically connected to the metal gates 121a and 121b. In some embodiments, the gate contacts 132a and 132b are formed through the second dielectric layer 130, the first dielectric layer 128 and the dielectric helmets 124a to 124b and in physical contact with the corresponding shielding layers 122a and 122b.

In some embodiments, the gate contacts 132a and 132b include metal, such as tungsten, copper, an alloy thereof or any metal material with suitable resistance and gap-fill capability. In some embodiments, a metal material layer is formed on the substrate 100 filling in the gate contact openings COPa and COPb by sputtering, CVD, electrochemical plating (ECP), a combination thereof or the like. A planarization process such as CMP is then performed to remove a portion of the metal material layer until the top of the second dielectric layer 130 is exposed. In some embodiments, the top surfaces of the gate contacts 132a and 132b are substantially coplanar with the top surface of the second dielectric layer 130.

In some embodiments, source and drain contacts 134 are further formed to electrically connect to the corresponding metal stacks 126. In some embodiments, the contact openings for the source and drain contacts 134 are defined during the operation of forming the contact openings COPa and COPb, and the source and drain contacts 134 are formed during the operation of forming the gate contacts 132a and 132b. In alternative embodiments, the source and drain contacts 134 may be formed before or after the operation of forming the gate contacts 132a and 132b.

After the operations of FIG. 1I to FIG. 1K, the gate contacts 132a and 132b are formed through the dielectric helmets 124a and 124b and are electrically connected to the metal gates 121a and 121b. A FinFET device is thus completed.

Poor filling of a metal layer is very common due to a high aspect ratio of the gate opening. Accordingly, the metal layer is formed with voids therein. Such voids affect the etching rate of the metal layer, and therefore, the adjacent metal gates are formed with different heights, the gate contacts electrically connected to the metal gates are formed with different depths, and the device reliability is accordingly degraded. However, such issues are not observed in the disclosure. Specifically, T-shaped gate openings of the disclosure replace the conventional I-shaped gate openings, and such T-shaped gate openings have wider tops for metal deposition and are beneficial to improve the performance of the metal gates and the gate contacts. More specifically, when a metal layer fills in the T-shaped gate openings, the metal layer is formed as a seamless or void-free metal layer. Accordingly, the subsequently formed metal gates and therefore gate contacts are formed with substantially the same heights, so the device reliability is accordingly improved.

In the above embodiments, the wide upper openings (e.g., first openings) of the T-shaped gate openings are formed by removing the upper portions of the dummy gates (as shown in FIG. 1B) before removing the upper portions of the gate spacers (as shown in FIG. 1C). However, the present disclosure is not limited thereto. The wide upper openings (e.g., first openings) of the T-shaped gate openings may be formed by exchanging the sequence of operations as needed. In some embodiments, the upper portions of the dummy gates are removed after the upper portions of the gate spacers are removed, which will be further described in FIG. 2B to FIG. 2D.

FIG. 2A to FIG. 2E are schematic cross-sectional views of a method of forming a FinFET device in accordance with alternative embodiments. The process flow of the FIG. 2A to FIG. 2E is similar to the process flow of FIG. 1A to FIG. 1K, so the difference between them is illustrated in the following, and the similarity is not iterated herein.

Figure 2A:
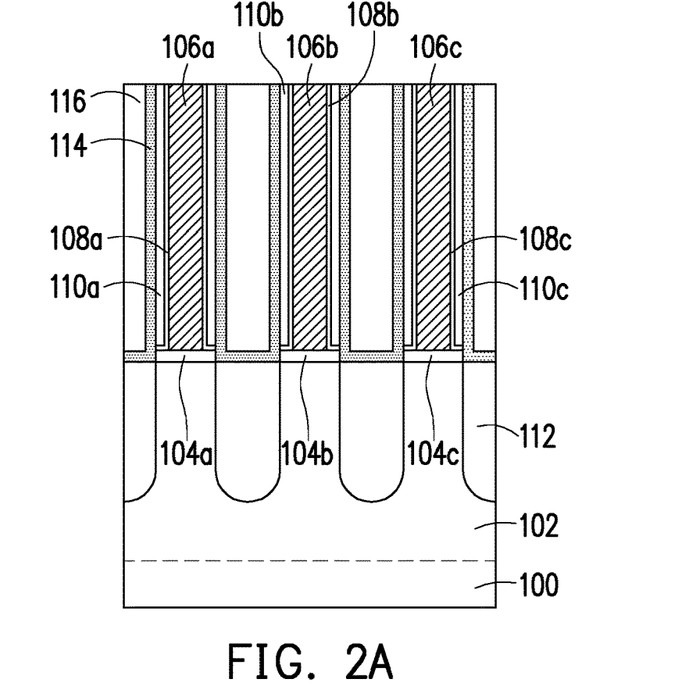
FIG. 2A to FIG. 2E are schematic cross-sectional views of a method of forming a FinFET device in accordance with alternative embodiments.

Referring to FIG. 2A, a structure similar to the structure of FIG. 1A is provided. The substrate 100 may have dummy gats 106a to 106c across the fins 102 and gate spacers 108a to 108c and 110a to 110c aside the dummy gates 106a to 106c.

Figure 2B:
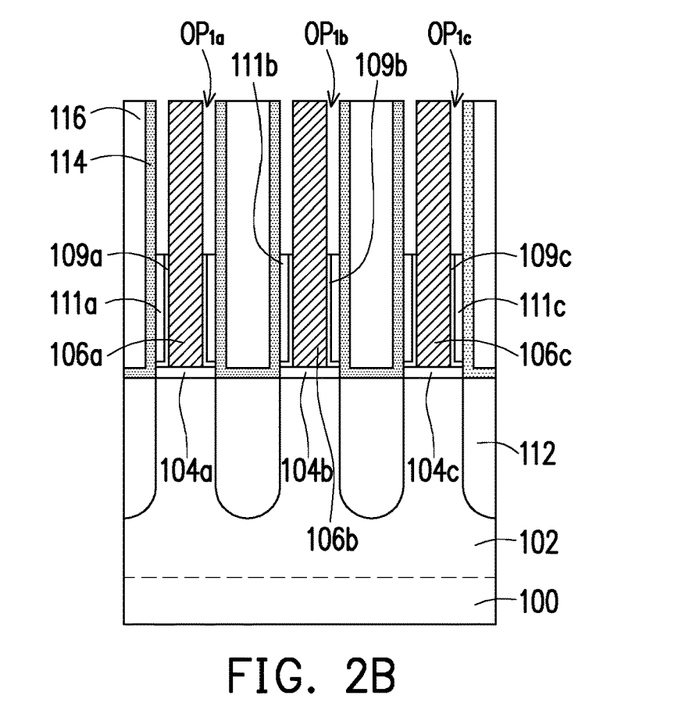

Referring to FIG. 2B, upper portions of the gate spacers 108a to 108c and 110a to 110c are removed, and thus, first openings $OP_{1a}$ to $OP_{1c}$ are formed in the dielectric layer 116. The lower portions of the gate spacers 108a to 108c and 110a to 110c or the remaining dummy gate spacers are referred to as gate spacers 109a to 109c and 111a to 111c. In some embodiments, the upper portions of the gate spacers 108a to 108c and 110a to 110c are removed by an etching process with an etch gas including $CHF_3$. In some embodiments, the first openings $OP_{1a}$ to $OP_{1c}$ are ring-shaped openings that respectively surround upper portions of the dummy gates 106a to 106c.

Figure 2C:
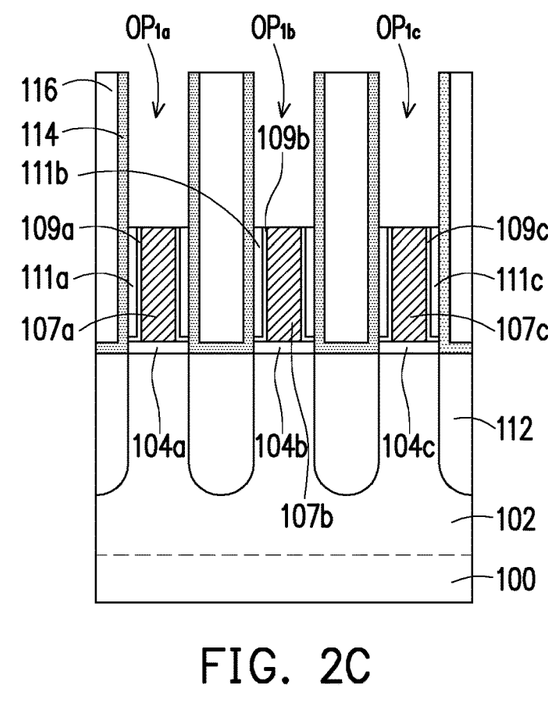

Referring to FIG. 2C, the exposed upper portions of the dummy gates 106a to 106c are removed so as to widen the first openings $OP_{1a}$ to $OP_{1c}$. The lower portions of the dummy gates 106a to 106c or the remaining dummy gates are referred to as dummy gates 107a to 107c. In some embodiments, the upper portions of the dummy gates 106a to 106c are removed by an etching process with an etch gas including $NF_3$.

Figure 2D:
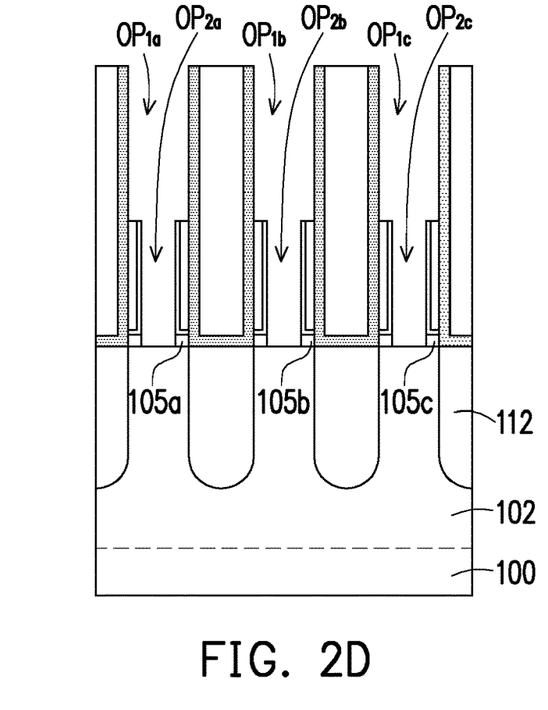

Referring to FIG. 2D, the dummy gates 107a to 107c (e.g., the lower portions of the dummy gates 106a to 106c) are removed, and therefore, second openings $OP_{2a}$ to $OP_{2c}$ are formed respectively below the first openings $OP_{1a}$ to $OP_{1c}$. In some embodiments, the dummy gates 107a to 107c (e.g., the lower portions of the dummy gates 106a to 106c) are removed by an etching process with an etch gas including $NF_3$. In some embodiments, portions of the interfacial layers 104a to 104c are removed during the removal of the dummy gates 107a to 107c. The remaining interfacial layers 104a to 104c are referred to as interfacial layers 105a to 105c.

After the operations of FIG. 2C and FIG. 2D, the dummy gates 106a to 106c are completely removed. Although multiple operations are described in FIG. 2C and FIG. 2D, the dummy gate removal may be implemented by a single operation as needed.

Figure 2E:
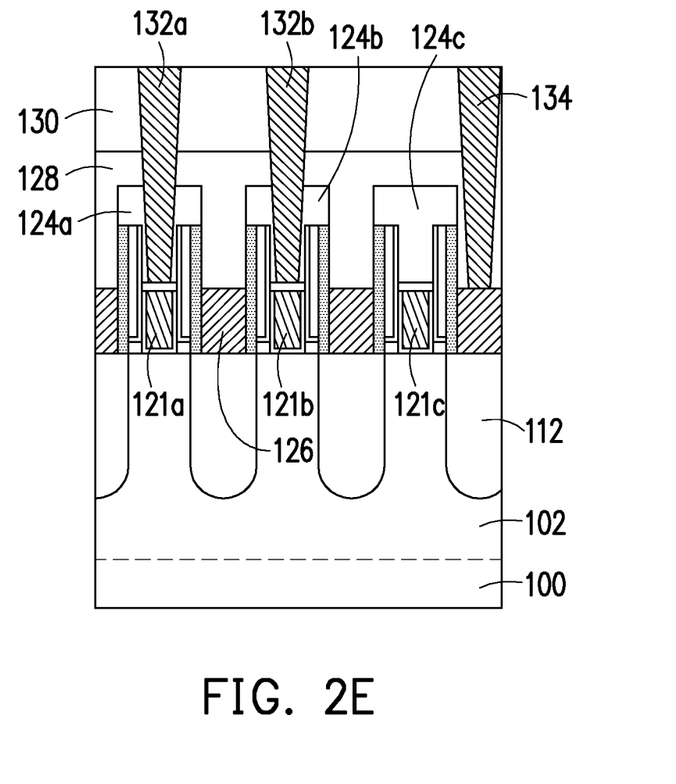

Referring to FIG. 2E, operations similar to the operations described in FIGS. 1E-1K are performed, so as to form a FinFET device similar to the FinFET device as shown in FIG. 1K.

In the above embodiments, the FinFET device is configured for narrow gate pitch applications, so the metal gate stacks mainly include work function metal layers, as shown in FIG. 1K and FIG. 2E. In some embodiments, the narrow gate pitch is about 50 nm or less. However, the present disclosure is not limited thereto. In some embodiments, when the FinFET device is designed for wide gate pitch applications, the metal gate stacks may include some metal layers and/or dielectric layers other than the work function metal layers. In some embodiments, the wide gate pitch is greater than about 50 nm, about 100 nm or more.

Figure 3A:
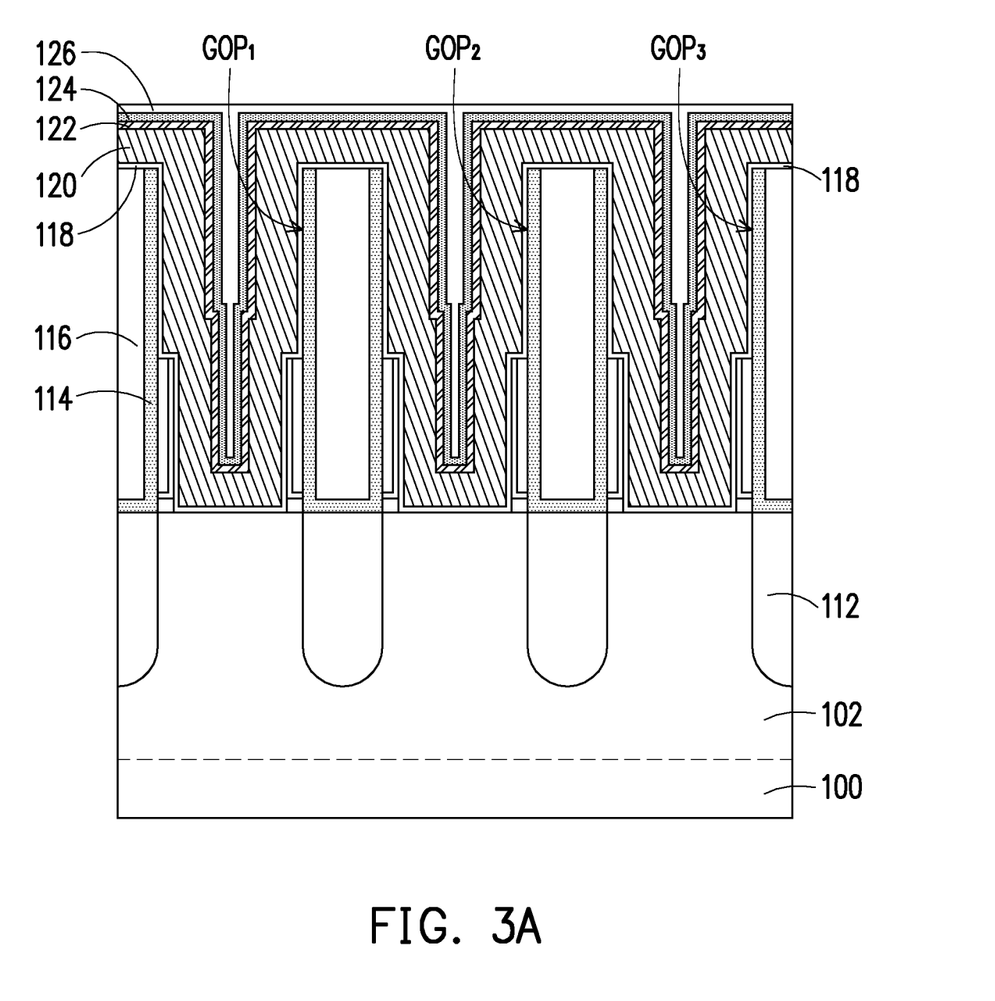
FIG. 3A to FIG. 3B are schematic cross-sectional views of a method of forming a FinFET device in accordance with yet alternative embodiments.
Figure 3B:
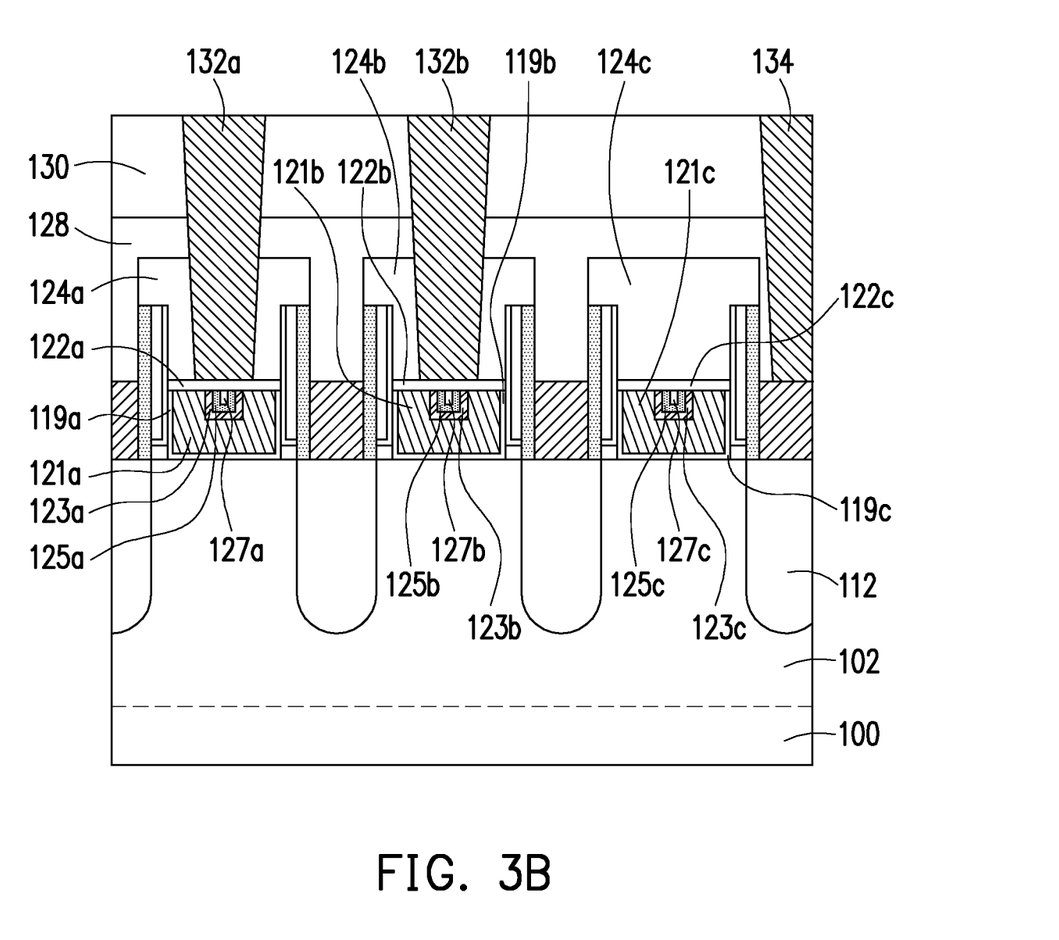

FIG. 3A to FIG. 3B are schematic cross-sectional views of a method of forming a FinFET device in accordance with yet alternative embodiments. The process flow of the FIG. 3A to FIG. 3B is similar to the process flow of FIG. 1A to FIG. 1K, so the difference between them is illustrated in the following, and the similarity is not iterated herein.

Operations similar to the operations described in FIGS. 1A-1E are performed, so as to form a structure as shown in FIG. 3A. In some embodiments, when the T-shaped openings $GOP_1$ to $GOP_3$ have a wide pitch arrangement, a metal layer 120, a low-resistance layer 122, a first capping layer 124 and a second capping layer 126 are formed in the T-shaped gate openings $GOP_1$ to $GOP_3$.

Referring to FIG. 3B, operations similar to the operations described in FIGS. 1F-1K are performed, so a FinFET device having a wide gate pitch arrangement is formed. In some embodiments, metal gates 121a to 121c, low-resistance patterns 123a to 123c, first capping patterns 125a to 125c and second capping patterns 127a to 127c are respectively formed in the lower portions of the T-shaped gate openings $GOP_1$ to $GOP_3$. Specifically, each of the second capping patterns 127a to 127c may have an I-shaped configuration, and each of the first capping patterns 125a to 125c, the low-resistance patterns 123a to 123c and the metal gates 121a to 121c may have a U-shaped configuration. In some embodiments, the shielding layers 122a to 122c are respectively in physical contact with the metal gates 121a to 121c, the low-resistance patterns 123a to 123c, the first capping patterns 125a to 125c and the second capping patterns 127a to 127c.

In some embodiments, the gate dielectric layers 119a to 119c, the metal gates 121a to 121c, the low-resistance patterns 123a to 123c, the first capping patterns 125a to 125c and the second capping patterns 127a to 127c constitute metal gate stacks (or called "replacement gate stacks").

Other components such as gate spacers, etch stop patterns, metal stacks, dielectric layers, gate contacts and source and drain contacts are similar to those described in FIG. 1K, and the details are not iterated herein.

The FinFET device of the disclosure is thus completed with the described process operations. However, it is not limited to add one or more additional operations among the above operations for fabricating the FinFET device.

The structures of the FinFET devices of the disclosure are described below with reference to FIG. 1K, FIG. 2E and FIG. 3B.

In some embodiments, the FinFET device of the disclosure includes metal gates 121a to 121c, gate spacers 109a to 109c and 111a to 111c, and T-shaped dielectric helmets 124a to 124c. The metal gates 121a to 121c are disposed over a substrate 100. The gate spacers 109a and 111a are disposed on the opposing sidewalls of the metal gate 121a, the gate spacers 109b and 111b are disposed on the opposing sidewalls of the metal gate 121b, and the gate spacers 109c and 111c are disposed on the opposing sidewalls of the metal gate 121c. In some embodiments, the gate spacers 109a to 109c and 111a to 111c are protruded out from the tops of the metal gates 121a to 121c.

The T-shaped dielectric helmets 124a to 124c are respectively disposed over tops of the metal gates 121a to 121c. In some embodiments, each of the T-shaped dielectric helmets 124a to 124c has a horizontal part and a vertical part, and the gate spacers 109a to 109c and 111a to 111c are aside the vertical parts of the T-shaped dielectric helmets 124a to 124c and in physical contact with the horizontal parts of the T-shaped dielectric helmets 124a to 124c.

In some embodiments, the metal gates 121a to 121c are void-free or void-less metal gates. In some embodiments, the tops of the metal gates 121a to 121c are substantially coplanar. Specifically, the height difference between the top of the metal gate 121a, the top of the metal gate 121b and the top of the metal gate 121c is about 30% or less. The height difference between adjacent metal gates may be, for example but not limited to, less than about 30%, 25%, 20%, 15%, 10%, 5%, including any range between any two of the preceding values.

In some embodiments, the FinFET device further includes gate contacts 132a and 132b that penetrate through dielectric helmets 124a and 124b and are electrically connected to the metal gates 121a and 121b. The gate contacts 132a and 132b have substantially the same heights, so the device reliability is accordingly improved.

In some embodiments, the FinFET device further includes metal stacks 126, a first dielectric layer and a second dielectric layer 130. The metal stacks 126 are aside the metal gates 121a to 121c. One metal stack 126 is between the adjacent metal gates. In some embodiments, the tops of the metal stacks 126 are substantially coplanar with the tops of metal gates 121a and 121b. The first dielectric layer 128 is disposed over the metal stacks 126 and the dielectric helmets 124a to 124c. The second dielectric layer 130 is disposed over the first dielectric layer 128.

In some embodiments, the FinFET device further includes source and drain contacts 134 that penetrate through the second dielectric layer 130, the first dielectric layer 128 and the metal stacks 126, and are electrically connected to the strained layers 112. In some embodiments, the source and drain contacts 134 have substantially the same heights as those of the gate contacts 132a and 132b, so the device reliability is accordingly improved.

In some embodiments, the FinFET device further includes interfacial layers 105a to 105c (labelled in FIG. 1G) below the gate spacers 109a to 109c and between the gate stacks 121a to 121c and the metal stacks 126.

In some embodiments, the FinFET device further includes etch stop patterns 115a to 115c (labelled in FIG. 1H) between the first dielectric layer 128 and the gate spacers 111a to 111c and aside the lower parts of the dielectric helmets 124a to 124c.

In some embodiments, the FinFET device further includes metal shielding layers 122a and 122b (labelled in FIG. 1H) between the gate contacts 132a and 132b and the metal gates 121a and 121b. Besides, optional metal shielding layers may be disposed between the source and drain contacts 134 and the metal stacks 126.

The above embodiments in which each of the gate dielectric layers, the metal gates, the gate spacers, the dielectric layers, the shielding layers, and the contacts is a single layer are provided for illustration purposes, and are not construed as limiting the present disclosure. In some embodiments, at least one of these described components may be a multi-layer structure as needed.

In the above-mentioned embodiments, a "gate last" process is implemented to form a FinFET device. However, another process such as a "gate first" process or another type of device (e.g., planar device) may be applied by using similar processes as described herein. The methods disclosed herein may be easily integrated with a CMOS process flow and do not require additional complicated operations to achieve the desired results. It is understood that embodiments disclosed herein offer different advantages, and that no particular advantage is necessarily required for all embodiments.

In view of the above, in some embodiments, the T-shaped gate openings of the disclosure replace the conventional I-shaped gate openings, and such T-shaped gate openings have wider tops for metal deposition and are beneficial to improve the performance of the metal gates and the gate contacts. More specifically, when a metal layer fills in the T-shaped gate openings, the metal layer is formed as a seamless or void-free metal layer. Accordingly, the subsequently formed metal gates and therefore gate contacts are formed with substantially the same heights, so the device reliability is accordingly improved.

In accordance with some embodiments of the present disclosure, a method of forming a FinFET device that includes the following operations. A dummy gate is formed over a substrate, and the dummy gate has gate spacers on opposing sidewalls thereof. A dielectric layer is formed around the dummy gate. An upper portion of the dummy gate is removed and upper portions of the gate spacers are removed, so as to form a first opening in the dielectric layer. A lower portion of the dummy gate is removed to form a second opening below the first opening. A metal layer is formed in the first and second openings. The metal layer is partially removed to form a metal gate.

In accordance with alternative embodiments of the present disclosure, a method of forming a FinFET device that includes the following operations. A first dummy gate and a second dummy gate are formed over a substrate, and the first dummy gate and the second dummy gate respectively have first gate spacers and second gate spacers on opposing sidewalls thereof. A dielectric layer is formed over the substrate aside the first and second dummy gates. The first and second dummy gates and portions of the first and second gate spacers are removed, and therefore, first and second T-shaped gate openings are formed in the dielectric layer. A metal layer is formed in the first and second T-shaped gate openings. The metal layer is partially removed to form first and second metal gates, and therefore, first and second helmet openings are formed in the dielectric layer.

In accordance with yet alternative embodiments of the present disclosure, a FinFET device includes first and second metal gates, first and second gate spacers and first and second T-shaped dielectric helmets. The first metal gate and the second metal gate are over a substrate. The first gate spacers are on opposing sidewalls of the first metal gate. The second gate spacers are on opposing sidewalls of the second metal gate. The first T-shaped dielectric helmet is over a top of the first metal gate. The second T-shaped dielectric helmet is over a top of the second metal gate. In some embodiments, a height difference between the top of the first metal gate and the top of the second metal gate is about 30% or less.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a FinFET device, comprising:
    forming a dummy gate over a substrate, the dummy gate having gate spacers on opposing sidewalls thereof;
    forming an etch stop layer on the gate spacers;
    forming a dielectric layer around the etch stop layer;
    removing an upper portion of the dummy gate and removing upper portions of the gate spacers, so as to form a first opening in the dielectric layer and therefore expose a portion of the etch stop layer;
    removing a lower portion of the dummy gate to form a second opening below the first opening;
    forming a metal layer in the first and second openings between remaining portions of the same gate spacers; and
    partially removing the metal layer to form a metal gate, and removing the exposed portion of the etch stop layer.

2. The method of claim 1, wherein the upper portion of the dummy gate is removed before the upper portions of the gate spacers are removed.

3. The method of claim 1, wherein the upper portion of the dummy gate is removed after the upper portions of the gate spacers are removed.

4. The method of claim 1, further comprising:
    forming a dielectric helmet over the metal gate and the remaining gate spacers; and
    removing the dielectric layer.

5. The method of claim 4, wherein the dielectric helmet comprises metal oxide, metal nitride or a combination thereof.

6. The method of claim 4, further comprising a gate contact penetrating through the dielectric helmet and electrically connected to the metal gate.

7. The method of claim 4, further comprising:
    forming a metal stack aside the metal gate; and
    forming another dielectric layer over the dielectric helmet and the metal stack.

8. The method of claim 1, further comprising, forming a gate dielectric material layer before forming the metal layer in the first and second openings.

9. A method of forming a FinFET device, comprising:
    forming a first dummy gate and a second dummy gate over a substrate, the first dummy gate and the second dummy gate respectively having first gate spacers and second gate spacers formed on opposing sidewalls thereof;
    forming a dielectric layer over the substrate aside the first and second dummy gates;

removing the first and second dummy gates and portions of the first and second gate spacers and therefore forming first and second T-shaped gate openings in the dielectric layer;

forming a metal layer in the first and second T-shaped gate openings; and partially removing the metal layer to form first and second metal gates and therefore form first and second helmet openings in the dielectric layer, wherein the first and second helmet openings expose top corners of remaining portions of the first and second gate spacers.

10. The method of claim 9, further comprising forming first and second dielectric helmets respectively in the first and second helmet openings.

11. The method of claim 10, further comprising forming first and second gate contacts penetrating through the first and second dielectric helmets and electrically connected to the first and second metal gates.

12. The method of claim 9, wherein removing the first and second dummy gates and the portions of the first and second gate spacers comprises:

removing upper portions of the first and second dummy gates;

removing upper portions of the first and second gate spacers; and removing lower portion of the first and second dummy gates.

13. The method of claim 9, wherein a dielectric constant of the first gate spacers is different from a dielectric constant of the second gate spacers.

14. The method of claim 10, wherein the first and second dielectric helmets comprise metal oxide, metal nitride or a combination thereof.

15. The method of claim 9, wherein a height difference between a top of the first metal gate and a top of the second metal gate is about 30% or less.

16. A method of forming a FinFET device, comprising:

forming a dielectric structure over a substrate, wherein the dielectric structure has a gate opening therein, wherein gate spacers are formed on opposing sidewalls of the gate opening;

forming a metal gate in a lower portion of the gate opening; and forming a T-shaped dielectric helmet over the metal gate in an upper portion of the gate opening, wherein the T-shaped dielectric helmet has a step that is engaged with tops and upper sidewalls of the gate spacers.

17. The method of claim 16, wherein the gate opening is a T-shaped opening.

18. The method of claim 16, further comprising:

forming a metal shielding layer between the metal gate and the T-shaped dielectric helmet; and forming a gate contact penetrating through the T-shaped dielectric helmet and in physical contact with the metal shielding layer.

19. The method of claim 16, further comprising:

removing a portion of dielectric structure to form a gap aside the metal gate; and forming a metal stack in a lower portion of the gap.

20. The method of claim 19, wherein a top of the metal stack is substantially coplanar with a top of metal gate.

* * * * *